(12) United States Patent
Tomasovics et al.

(10) Patent No.: US 8,866,655 B2
(45) Date of Patent: Oct. 21, 2014

(54) MODULATOR WITH VARIABLE QUANTIZER

(75) Inventors: Attila Tomasovics, Sun Rosier (SG);
Arno Rabenstein, Chancery Grove (SG)

(73) Assignee: Infineon Technologies AG, Neubiberg (DE)

( * ) Notice: Subject to any disclaimer, the term of this patent is extended or adjusted under 35 U.S.C. 154(b) by 35 days.

(21) Appl. No.: 13/571,601

(22) Filed: Aug. 10, 2012

(65) Prior Publication Data

US 2014/0043176 A1 Feb. 13, 2014

(51) Int. Cl.
*H03M 3/00* (2006.01)

(52) U.S. Cl.
CPC ....................................... *H03M 3/00* (2013.01)
USPC .......................................... 341/143; 341/200

(58) Field of Classification Search
CPC ............ H03M 3/00; H03M 3/02; H03M 3/32
USPC .................. 341/143, 155, 139, 200
See application file for complete search history.

(56) References Cited

U.S. PATENT DOCUMENTS

| | | | | | |
|---|---|---|---|---|---|
| 4,558,303 | A | * | 12/1985 | Fielden | 341/158 |
| 4,755,793 | A | * | 7/1988 | Neidorff | 341/163 |
| 5,057,841 | A | * | 10/1991 | Veerhoek et al. | 341/156 |
| 5,659,316 | A | * | 8/1997 | Stierli | 341/143 |
| 7,855,668 | B2 | * | 12/2010 | Akizuki et al. | 341/143 |
| 2007/0279258 | A1 | * | 12/2007 | Deligiannis | 341/50 |
| 2011/0068689 | A1 | | 3/2011 | Scenini et al. | |
| 2011/0291584 | A1 | | 12/2011 | Filippo et al. | |

FOREIGN PATENT DOCUMENTS

EP         2230885 A1    9/2009

* cited by examiner

*Primary Examiner* — Brian Young
(74) *Attorney, Agent, or Firm* — SpryIP, LLC (57) ABSTRACT

Representative implementations of devices and techniques provide a variable quantizer for a modulator. A compare value of the quantizer changes with each clock cycle of the modulator. The variable compare value results in a spread spectrum output of the modulator.

26 Claims, 7 Drawing Sheets

MODULATOR WITH VARIABLE QUANTIZER

BACKGROUND

With the proliferation of light-emitting-diode (LED) lamps, as well as other types of lamps, there are many applications which include dimming the lamps and changing the color of the lamps. For example, it is often desirable for LED lamps in residential and commercial applications to be dimmable. Additionally, it may be desirable for LED lamps to have the capability to change colors when used in instrumentation, user interface displays, and other information-related applications. Further, display screens for information or entertainment applications make use of LED lamps that dim and/or change colors.

Control signals originating from one or more dimming engines may be used to control the brightness, color, intensity, etc. of the lamp or of components of the lamp. However, the frequency spectrum of a typical control signal may be very narrow, especially when the control signal is stable for a period of time (e.g., when the brightness level is stable, etc.). If the narrow frequency band is aliased to a lower frequency, one that the human eye is sensitive to for example (e.g., due to a video recording of the lamp, etc.), unwanted visual effects may occur such as shimmering, rolling, and the like. Additionally, there can be electro-magnetic interference (EMI) and/or electro-magnetic compatibility (EMC) issues based on the narrow frequency band of the control signal.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

DETAILED DESCRIPTION

Overview

Representative implementations of devices and techniques provide a variable quantizer for use with a modulator. In various implementations, a modulator (such as a sigma-delta modulator (SDM), for example) may be used in a control signal path to generate a control signal bit stream. The control signal may be used to vary the intensity or brightness of a lamp, change the color of the lamp, and the like. For example, multiple control signals may be used to vary the intensity of multiple components of a lamp concurrently, thereby changing the overall color or brightness of the lamp.

In one implementation, a variable quantizer is used with the modulator to provide a less-periodic or spread spectrum output from the modulator. In an implementation, a compare value of the quantizer changes at each clock cycle of the modulator, resulting in a variable output from the quantizer. For example, uncorrelated quasi-random high frequency noise, or the like, can be added to the compare value of the quantizer, at each clock cycle.

Various implementations and techniques for a variable quantizer are discussed in this disclosure. Techniques and devices are discussed with reference to example light-emitting-diode (LED) lamps, devices, and systems. However, this is not intended to be limiting, and is for ease of discussion and illustrative convenience. The techniques and devices discussed may be applied to any of various lamp device designs, types, and the like (e.g., liquid-crystal-display (LCD), poly-vinyl-alcohol (PVA) display, piezoelectric material display, electron-stimulated lamps, incandescent lamps, electroluminescent (EL) lamps, etc.), as well as other continuously variable control systems that utilize one or more control signals, and remain within the scope of the disclosure.

Implementations are explained in more detail below using a plurality of examples. Although various implementations and examples are discussed here and below, further implementations and examples may be possible by combining the features and elements of individual implementations and examples.

Example Brightness Control Arrangement

Figure 1:
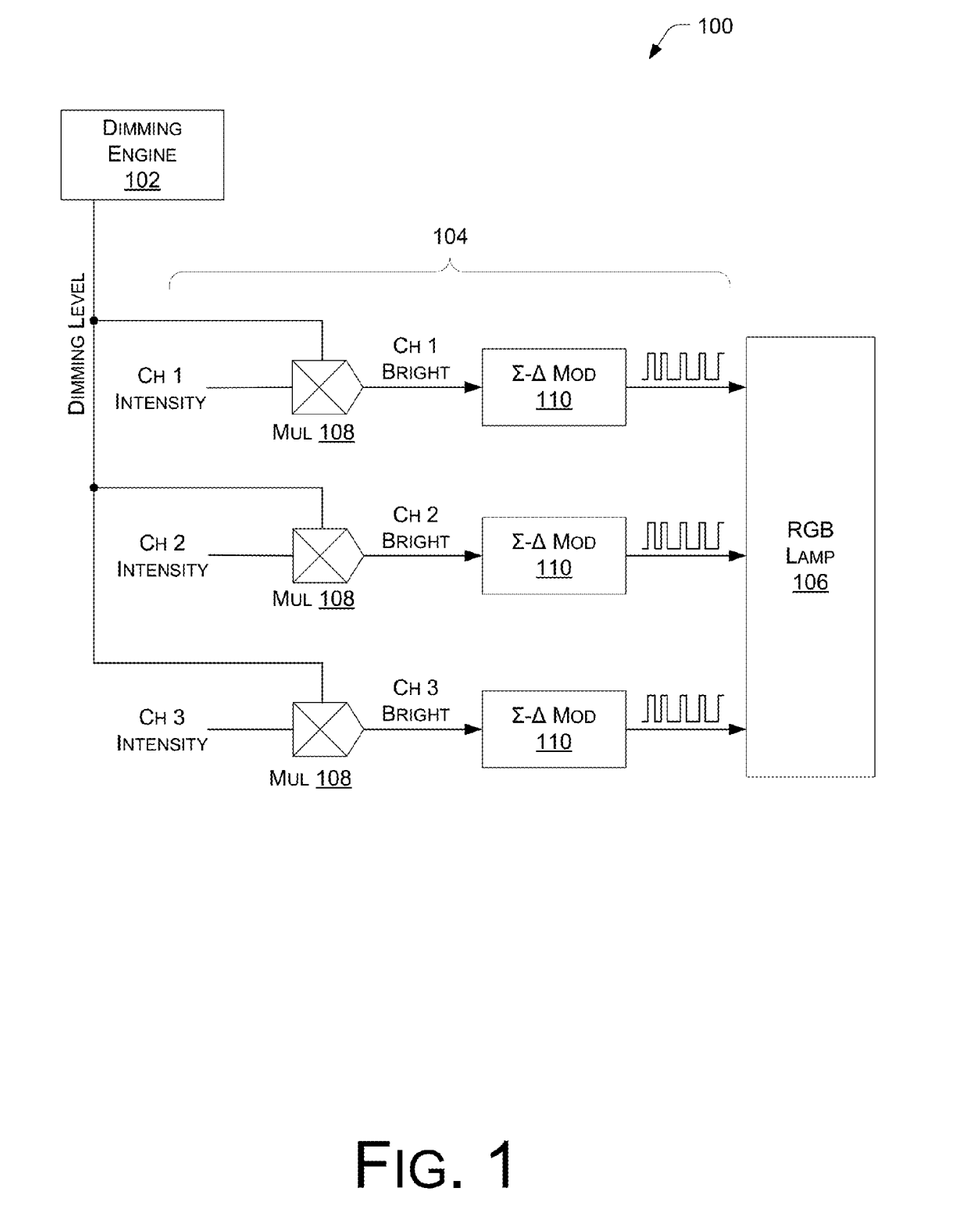
FIG. 1 is a block diagram of an example multi-channel brightness/color control arrangement for a lamp, in which the techniques described herein may be employed, according to an implementation.

FIG. 1 is a block diagram of an example multi-channel brightness/color control arrangement 100, in which the techniques described herein may be employed, according to an implementation. For example, the multi-channel brightness/color control arrangement 100 may be arranged to vary the brightness of a lamp, change the color of the lamp, and the like.

As illustrated in FIG. 1, an example multi-channel brightness/color control arrangement 100 may include one or more dimming engines 102, a quantity of channels 104, and a lamp 106, for example. In alternate implementations, fewer, additional, or alternative components may be included.

If included, a dimming engine 102 receives a dimming level value from a user for example, and distributes the dimming level value to each of the channels 104. In alternate implementations, the dimming level may be received from another source, such as from an output of a process, or the like. In some implementations, the dimming level is a binary value, an integer, or other similar value. The dimming level value determines the overall brightness of the lamp.

If included, each of the channels 104 may include a multiplier 108 and a modulator 110, for example. The multiplier 108 is arranged to receive the dimming level value from the dimming engine 102 and an intensity value (e.g., ch 1 intensity, ch 2 intensity, ch 3 intensity) for each channel 104, and combine them (e.g., multiply the dimming and intensity values) to form a brightness value (e.g., ch 1 bright, ch 2 bright, ch 3 bright). In an implementation, the intensity value is a binary value, an integer, or the like. For example, in one implementation, the multiplier 108 multiplies the dimming level value by the intensity value, where both are binary values, and retains a quantity of the most significant bits of the product as the output. In one implementation, the intensity value is user-selected.

In an implementation, the relative intensity values of each channel 104 determine the color and/or brightness of the lamp 106. For example, each of the channels 104 may represent a color (i.e., red, green, and blue for a three-color/channel lamp). A combination of a greater intensity on one or more of the channels 104 and a lesser intensity on remaining channels 104 results in a particular overall color or brightness of the lamp. Subsequently changing the intensity value of one or more of the channels 104 changes the color or brightness of the lamp.

In an implementation, the modulator 110 converts the brightness value to a high frequency bit stream. The bit streams from the channels 104 are the input signals to the lamp 106. In an implementation, the mean value of a bit stream corresponds to the brightness value at the input of the respective modulator 110. For the purposes of this disclosure, a bit stream may be described as a digital approximation of an analog input. For example, a bit stream may include a digital representation that is proportional to the magnitude of the voltage or current of the analog input, over a selected duration. The digital representation may be expressed in various ways (e.g., base 2 binary code, binary coded decimal, voltage values, electrical or light pulse attributes, and the like).

In one implementation, the modulator 110 is a sigma-delta modulator (SDM). Sigma-delta modulated currents from the modulator 110 result in a sigma-delta modulated brightness level at the lamp 106. Since the human eye has a limited bandwidth, it low-pass filters the varying brightness level output by the SDM. If the bit rate is sufficiently high, the eye senses the mean brightness of the lamp 106 that is dependent on the signal output from the SDM 110. In alternate implementations, other techniques and/or devices may be used to convert the brightness value output at the multiplier 108 to an input signal for the lamp 106. Further, in alternate implementations, the channels 104 may include alternate or additional components to control the brightness and/or color of the lamp 106.

In various implementations, the modulator 110 may be bypassed when a brightness value is output from the multiplier 108 that represents nearly 0% or nearly 100% of the lamp 106 capacity or control signal level. In that case, a corresponding brightness value signal may be fed to the lamp 106 directly. For example, if the desire is for the lamp 106 to be off (e.g., a control signal value near 0%), there is no need for a modulated signal to be sent to the lamp 106. Rather, an off signal (or the lack of any brightness signal) may be sufficient to turn the lamp off. Conversely, if the desire is for the lamp to be at or near 100%, there is no need for a modulated signal to be sent to the lamp 106 then either. Rather, a signal representing full capacity may be sent directly to the lamp 106, bypassing the modulator 110.

In alternate implementations, various dimming and/or brightness levels may be assigned to be treated as nearly 0% (e.g., 0-3%) and nearly 100% (e.g., 97-100%) for the purposes of bypassing the modulator 110. In other implementations, other values and/or ranges may be used, corresponding to the application.

As discussed above, the lamp 106 may be an LED lamp, another type of lamp, or another controlled system that uses variable control signals. In one implementation, changes to the dimming level value and/or to the intensity value at one or more of the channels 104 changes the brightness and/or color of the lamp 106.

In alternate implementations, a multi-channel brightness/color control arrangement 100 may include fewer, additional, or alternate components.

Figure 2:
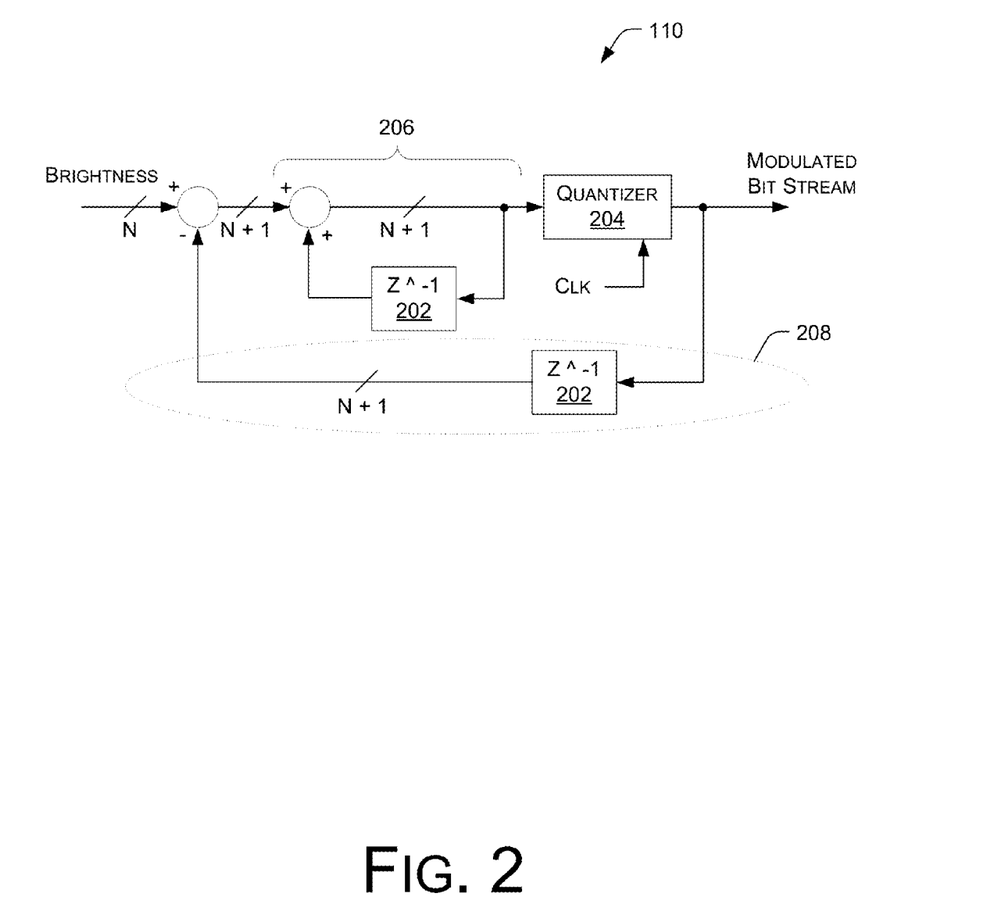
FIG. 2 is a block diagram of an example modulator including a quantizer, which may be employed with the multi-channel brightness/color control arrangement of FIG. 1, for example, according to an implementation.

FIG. 2 is a block diagram of an example modulator 110 including a quantizer 204, which may be employed with the multi-channel brightness/color control arrangement 100 of FIG. 1, for example, according to an implementation. As shown in FIG. 2, the modulator 110 receives an input signal, which is the brightness level and outputs a modulated bit stream, which is a control signal for the lamp 106 or other control system, etc. In one implementation, the modulator(s) 110 for each of the channels 104 provide the control signals to the channels 104 dynamically as the input value (i.e., brightness level) changes. For example, the modulator 110 (i.e., SDM, etc.) controls the color, intensity, and/or brightness of the lamp 106.

The modulator 110 is illustrated in FIG. 2 as a first-order SDM. For example, the modulator 110 is shown as including a quantity of integrators 206 (shown in the form of a feedback loop in FIG. 2), and a quantizer 204. This arrangement is not intended as a limitation. The techniques and devices described herein are applicable to modulators of other types, configurations, and designs. Further, in alternate implementations, a modulator 110 may include fewer, additional, or alternate components.

Generally, the modulator 110 oversamples a multi-bit input signal (i.e., brightness) and converts it to a high frequency 1-bit signal or stream. In other words, the modulator encodes the input values into a bit stream. The mean value of the output control signal directly corresponds to the input value (i.e., brightness).

The input value (i.e., brightness) is sampled at the modulator clock rate supplied by the clock signal "clk." The maximum allowed input frequency is $f_{clk}/2^N$ where the value $2^N$ is the maximum value of the input range of input values (e.g., 4096 when N=input bits=12). If the input value changes faster than this rate, information may be lost, however, this is generally not noticeable by the human eye since the frequencies involved are very high. The output bit rate of the modulated bit stream is $f_{clk}$ (e.g., 40 kHz, for example).

The mean value of the output control signal is substantially equal to the mean of the input value. This mean value is realized by a corresponding average density of pulses. If the input brightness value is higher, the density of the output pulses will also be higher. This is described as pulse density modulation (PDM).

In an implementation, as shown in FIG. 2, this is achieved with one or more integrators 206, the 1-bit quantizer 204, and one or more feedback paths. The quantizer 204 is usually realized as a comparator with a compare value of $2^N$, or some other compare value. In general, although exemplary power operators or functions for values are indicated herein, other values, power operators, and functions may also be used. At nonzero input levels, the integrator(s) 206 will accumulate the input level and eventually reach a compare level (i.e., compare value). When that happens, a pulse (e.g., an ON-bit or an OFF-bit) is generated at the output of the quantizer 204, and the negative feedback path 208 "resets" the integrator(s) 206 by decreasing the integrated value by $2^N$. The higher the input value, the earlier and more often the integrator(s) 206 will reach the compare level. Until the accumulated value (a.k.a. the integrated value) reaches the compare level, the quantizer 204 outputs an OFF-bit (or an ON-bit if an OFF-bit is generated at the output of the quantizer 204 in response to the compare level being reached) at each clock cycle, based on the delay of the feedback loop.

Example Variable Quantizer

Figure 3:
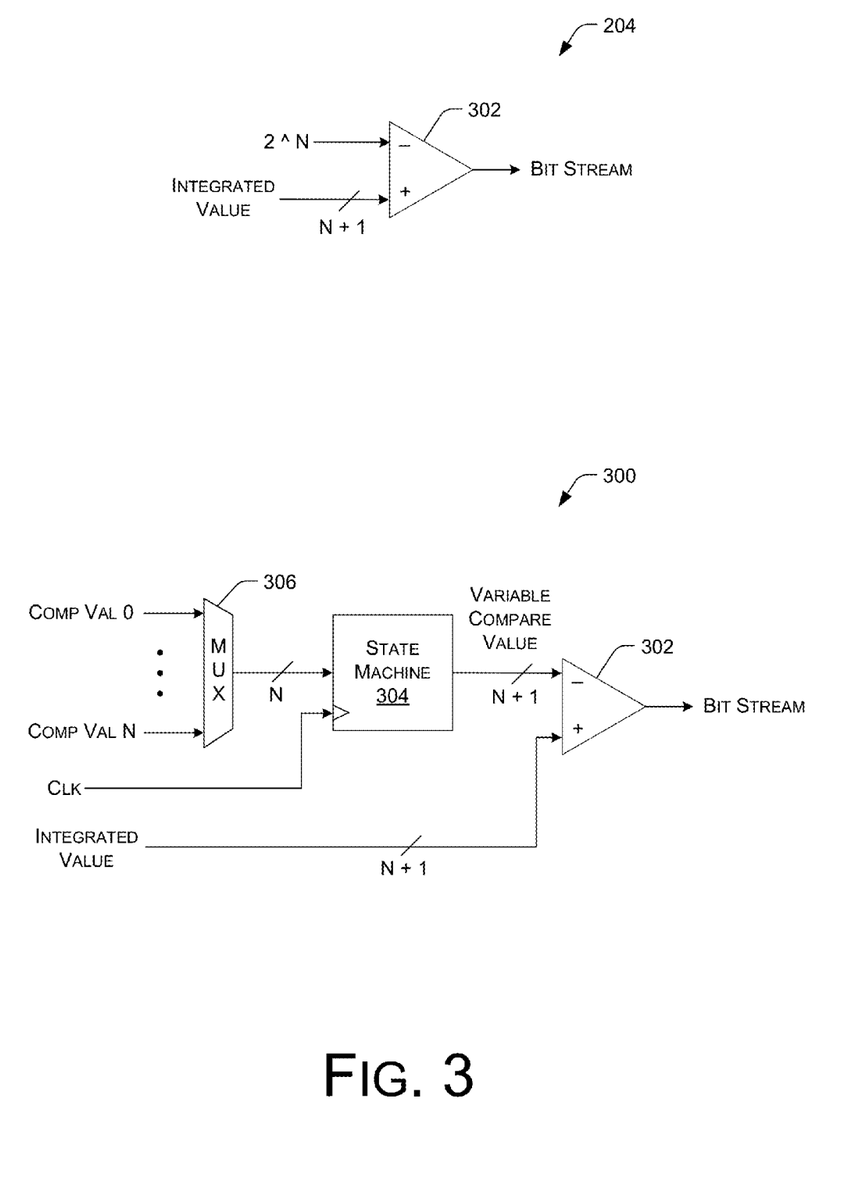
FIG. 3 includes a block diagram of a first quantizer, which may be employed with the modulator of FIG. 2, for example, and a block diagram of a second variable quantizer, which may be employed with the modulator of FIG. 2, for example, according to various implementations.

The top portion of FIG. 3 includes a block diagram of a quantizer 204, which may be employed with the modulator 110 of FIG. 2, for example. The quantizer 204 is realized using a comparator 302 as discussed above. As shown in the illustration of FIG. 3, the integrated value is compared to a compare value, here $2^N$ as an exemplary value, the maximum value of the input range (4096, for example). The comparator 302 outputs an OFF-bit during each clock cycle that the integrated value is less than the compare value. When the integrated value becomes equal to or greater than the compare value, the comparator 302 outputs an ON-bit. When the comparator 302 outputs an ON-bit, the negative feedback path 208 is activated, the output of the delay block becomes $2^N$ instead of 0, and the integrated value is decreased. The integrated value keeps decreasing as long as the negative feedback path 208 is active.

The bottom portion of FIG. 3 includes a block diagram of a variable quantizer 300, which may be employed with the modulator 110 of FIG. 2, for example, according to various implementations. The variable quantizer 300 illustrated in FIG. 3 is shown as a single channel 104 arrangement. In various implementations, multiple variable quantizers 300 may be used to provide control signal bit streams for multiple channels 104 of a multi-channel brightness/color control arrangement 100, for example.

In an implementation, the variable quantizer 300 is a hardware device arranged to dynamically provide a control signal to the channel 104 as the brightness value changes. In an implementation, the variable quantizer 300 is arranged in such a way that the modulator 110 outputs a bit stream comprising a constantly varying quasi-random pulse density modulated signal. Accordingly, in an implementation, the output of the sigma-delta modulator 110 has a spread spectrum frequency band based on the variable quantizer 300. Thus, in various implementations, the output of the SDM 110 is a non-periodic or quasi-periodic (i.e., with a limited periodicity, etc.) bit stream. The spread spectrum output has the effect of reducing the effects of aliasing as well as reducing electro-magnetic interference, based on spreading the power of the signal across a wide range of frequencies at a reduced magnitude.

In an implementation, the variable quantizer 300 is arranged to compare an integrated signal to a compare value, as described above with reference to the quantizer 204 and the comparator 302. For example, one or more of the integrators 206 receive and integrate the input signal (i.e., brightness level) to form an integrated signal. The integrated (or accumulated) signal accumulates at the integrator(s) 206, due to the one or more feedback paths (as shown in FIG. 2, for example).

In an implementation, the variable quantizer 300 outputs an ON-bit (e.g., a high-bit, a one-bit, etc.) when the integrated value is equal to or greater than the compare value. Otherwise, the variable quantizer 300 outputs an OFF-bit (e.g., a low-bit, a zero-bit, etc.) when the integrated value is less than the compare value. In various implementations, the variable quantizer 300 outputs an ON-bit or an OFF-bit at each clock cycle of the modulator 110, based on the comparison of the integrated value with the compare value. When the variable quantizer 300 outputs an ON-bit, the negative feedback path 208 is activated, the output of the delay block becomes $2^N$ instead of 0, and the integrated value is decreased. The integrated value keeps decreasing as long as the negative feedback path 208 is active.

However, in an implementation, the variable quantizer 300 is arranged to add uncorrelated quasi-random noise to the compare value at each clock cycle. For example, the noise is uncorrelated to the output of the integrator(s) 206 and has a zero mean, in order not to influence the mean value of the output bit stream. This results in the compare value changing, and being a different value, at each clock cycle. Accordingly, even when the input signal (i.e., brightness level) is substantially steady, the integrated signal will be equal to or greater than the compare value at quasi-random time intervals. This has the effect of reducing the periodicity of the output bit stream of the variable quantizer 300 and the modulator 110.

In an implementation, as described above, the lamp 106 (or one or more components of the lamp 106), or other types of control system loads, may comprise a variable load coupled to one or more channels 104. In various implementations, the variable loads may be arranged to receive the bit stream control signal from the variable quantizer 300 and the modulator 110. For example, an intensity and/or a brightness of the variable load may be adjustable based on the bit stream control signal.

In one example, as shown in the lower portion of FIG. 3, a variable quantizer 300 may include a comparator 302, a state machine 304, and a multiplexer 306. In alternate implementations, a variable quantizer 300 may include fewer, additional, or alternate components.

In various implementations, the variable quantizer 300 makes the comparisons and outputs described above via the comparator 302. For example, in an implementation, the comparator 302 is arranged to compare the compare value to the accumulated value and to output a non-periodic bit stream based on a result of the comparison. The comparator 302 outputs an ON-bit when the accumulated value is equal to or greater than the compare value and outputs an OFF-bit when the accumulated value is less than the compare value. Accordingly, the comparator 302 is arranged to generate a spread spectrum output signal, as described above.

If included, the state machine 304 is arranged to output a compare value to the comparator 302 during a clock cycle. In an implementation, the compare value is one of a plurality of compare values. In various implementations, the state machine 304 outputs each of the plurality of compare values in a predetermined order to the comparator 302. For example, in one implementation, the state machine 304 outputs each compare value of the plurality of compare values in a preselected rotation, one compare value per clock cycle. In other implementations, the state machine 304 randomly outputs one of the plurality of compare values during each clock cycle. In an alternate implementation, the state machine 304 may output compare values according to a predefined pattern, calculated order, or the like.

In an implementation, the plurality of compare values is formed by adding high frequency quasi-random noise to the compare value $2^N$ (i.e., the maximum value of the input range). In various implementations, this is accomplished using many different techniques. In various implementations, a device or component arranged to add high frequency noise to the compare value may be referred to as a noise generator, for example (e.g., the state machine 304, the input component 402 of FIG. 4, etc.).

Figure 4:
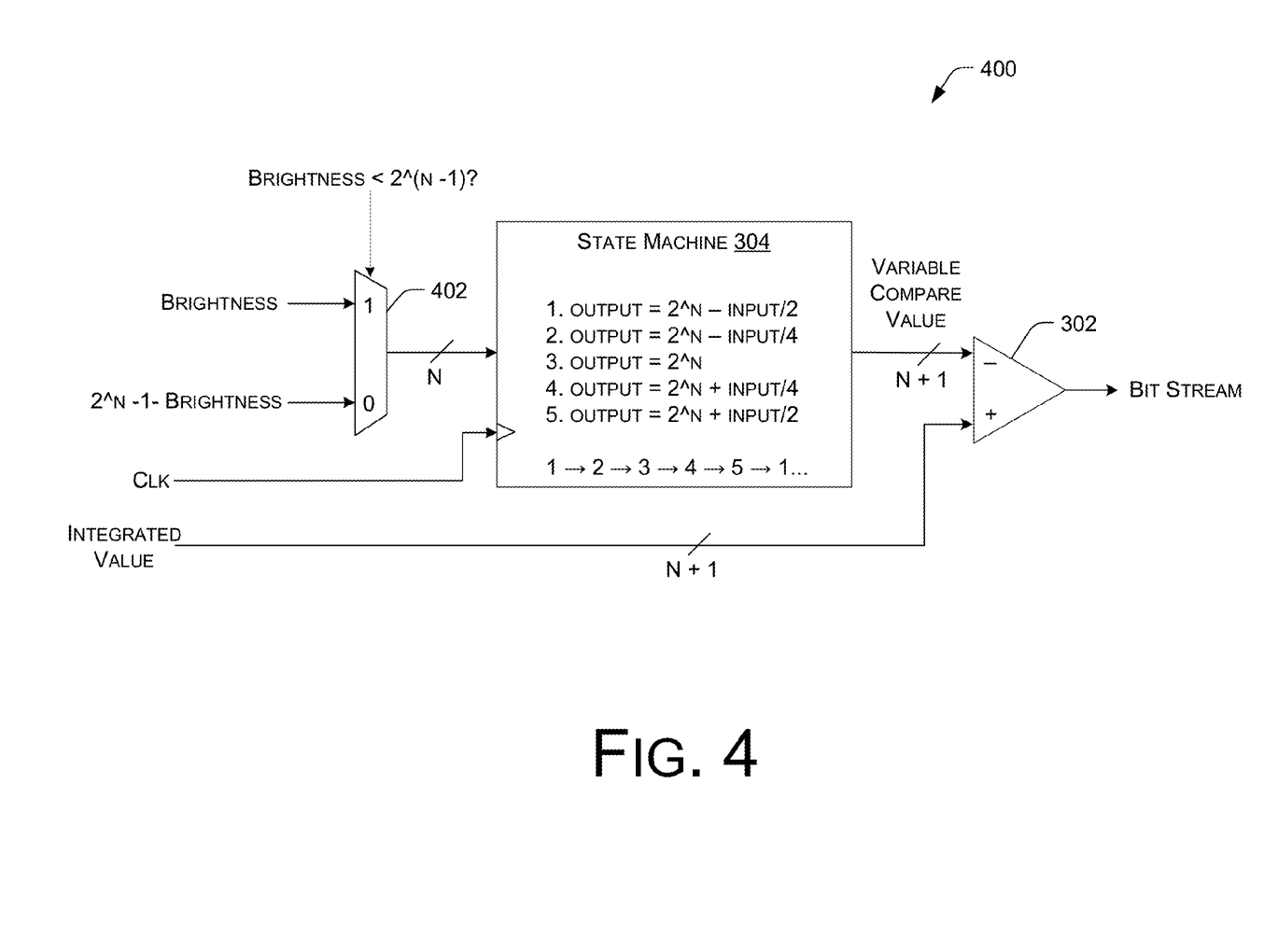
FIG. 4 is a block diagram of another quantizer, including a detail of a state machine, according to another implementation.

In one implementation, the plurality of compare values is formed by combining a fraction of the input value with the maximum value of the input range. This technique is illustrated in FIG. 4, for example. As shown in FIG. 4, a set (or plurality) of compare values may be formed around the maximum value of the input range ($2^N$). The state machine 304 may select one of the plurality of compare values and output it to the comparator 302 at each clock cycle, changing the compare value at each clock cycle. Although 5 compare values are showing in the example shown in FIG. 4, the set may have any number of compare values, so long as the average value of the plurality of compare values is substantially equal to the maximum value of the input range (e.g., $2^N$, for example).

For example, a set of compare values may be formed by dividing the input value (i.e., brightness level) by a first divider value (e.g., −2) to form a first offset (e.g., "output=2^N−Input/2") and dividing the input value by a second divider value (e.g., +2) to form a second offset (e.g., "output=2^N+Input/2"), where the second divider value comprises a value having an opposite polarity and an equal magnitude to the first divider value. Offsets are added to the maximum value of the input range to form the variable compare values. In other words, a noise generator, for example, adds one half of the value of the input signal to the maximum value of the input range during one clock cycle of the sigma-delta modulator 110 to form a variable compare value during the one clock cycle. Further, the noise generator, for example, subtracts one half of the value of the input signal from the maximum value of the input range during another clock cycle of the sigma-delta modulator 110 to form the variable compare value during the other clock cycle.

As shown in FIG. 4, example divider values of (−2, 2) and (−4, 4) are used to form compare values in the illustrated example. These divider values, in combination with the maximum value of the input range (e.g., $2^N$), are used to form a set (or plurality) of compare values for the state machine 304 to select from. This arrangement generates quasi-random noise that is uncorrelated to the output of the integrator(s) 206. In an implementation, the noise has a zero mean (e.g., a sawtooth waveform, etc.) and an amplitude that is dependent on the brightness level. In various implementations, any other divider value combinations may be used in like manner, so long as the average value of the whole set, or plurality, of compare values is substantially equal to the maximum value of the input range.

In various implementations, a plurality of compare values may be calculated as needed, based on a formula, for example. In other implementations, the plurality of compare values may be pre-calculated and stored in a table (e.g., in a hardware memory storage device), in one or more logic devices, and the like.

Referring back to FIG. 3, if included, a multiplexer multiplexer 306, or the like, may be arranged to output the plurality of compare values to the state machine 304. For example, if the plurality of compare values is stored in a memory storage device, in one or more logic devices, or the like, the multiplexer 306 may retrieve them as needed during each clock cycle.

In various implementations, some or all components of the variable quantizer 300 may be implemented using one or more logic devices or components. For example, some or all of the components of the comparator 302, the state machine 304, and/or the multiplexer 306 may be implemented as separate or integrated digital logic devices.

As discussed above, the techniques, components, and devices described herein with respect to the variable quantizer 300 are not limited to the illustrations in FIGS. 3 and 4, and may be applied to other devices and designs without departing from the scope of the disclosure. In some cases, additional or alternative components may be used to implement the techniques described herein. Further, the components may be arranged and/or combined in various combinations, while resulting in the spread spectrum output. It is to be understood that a variable quantizer 300 may be implemented as a stand-alone device or as part of another system (e.g., integrated with other components, systems, etc.).

Example Implementations

FIG. 4 is a block diagram of another variable quantizer 400, according to another implementation. For example, the variable quantizer 400 is a variable quantizer 300, as described above, including an input component 402. The input component 402 adjusts the input value (i.e., brightness) under predefined conditions to avoid overflow of the state machine 304, and improve the resolution of the compare values output by the state machine 304.

In one implementation, as shown in FIG. 4, the variable quantizer 400 includes an input component 402 arranged to output the input value (i.e., brightness) to the state machine 304 if the input value is less than 50 percent of the maximum value of the input range. Otherwise, the input component 402 outputs another input value to the state machine 304. For example, in one implementation, the input component outputs a different input value equal to one less than the maximum value of the input range reduced by the input value, if the input value is greater than 50 percent of the maximum value of the input range.

In other words, as shown in FIG. 4, the input component 402 checks whether the input value is less than 50% of the maximum brightness value (e.g., 4096). If it is, then the input component 402 sends it on to the state machine 304. If the input value is greater than 50% of the maximum brightness value, then the input component 402 reduces the input value before sending it to the state machine 304. In the implementation, the input component 402 reduces the input value by one less than the maximum value of the input range, minus the input value (e.g., (4096−1)−brightness level). This reduces the input value to a value less than 50% of the maximum value of the input range.

In various implementations, the state machine 304 processes the input value in the manner described above whether the input value has been passed to the state machine 304 as the input component 402 received it, or whether the input value has been reduced by the input component 402.

In alternate implementations, an input component 402 may adjust the input value (i.e., brightness) using various other techniques, formulas, and the like. Further, a variable quantizer 400 may include additional or alternative components to accomplish the techniques described herein.

Figure 5:
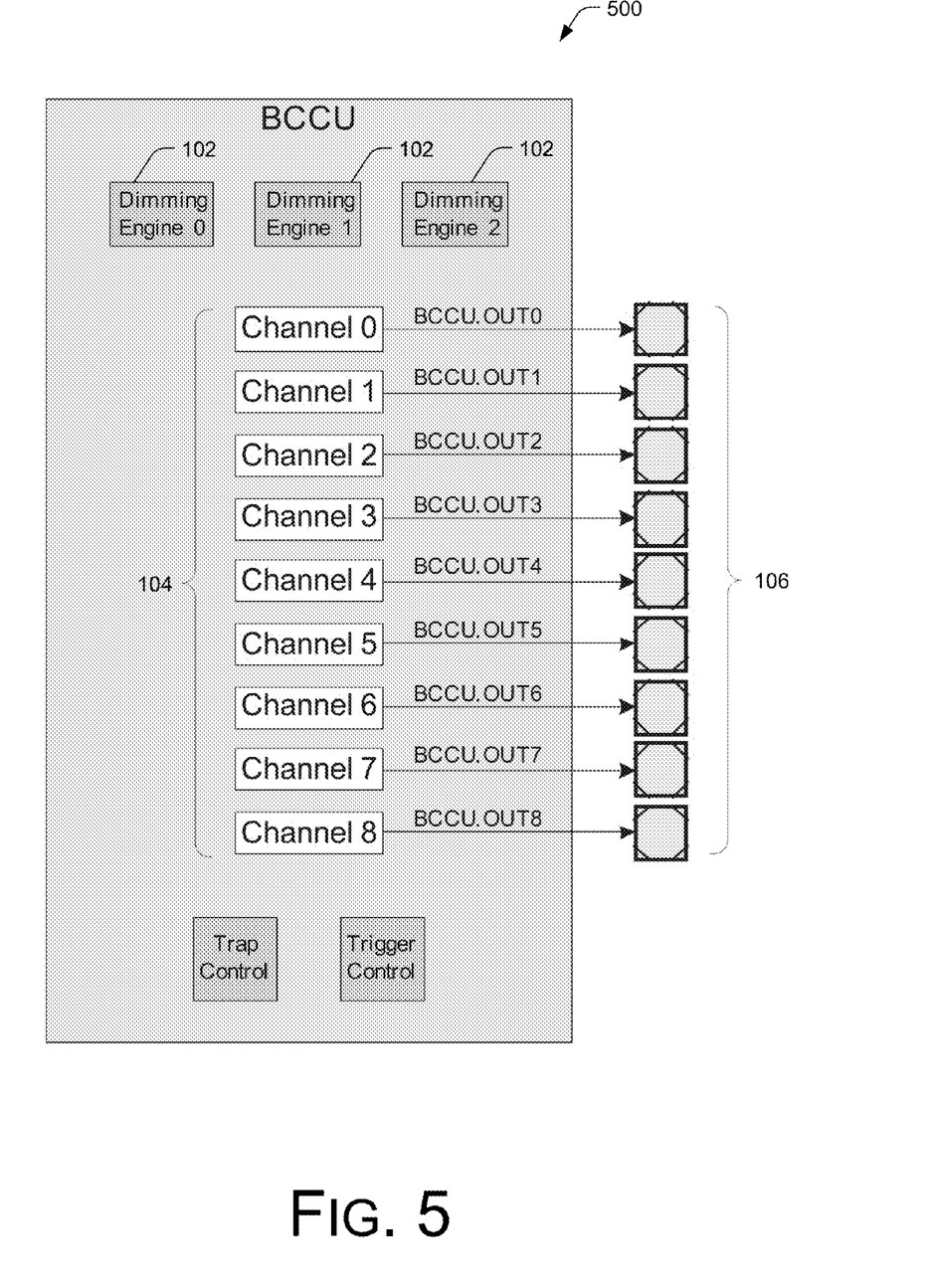
FIG. 5 is a block diagram of an example integrated brightness and color control unit (BCCU), which may incorporate a variable quantizer arrangement, according to an implementation.
Figure 6:
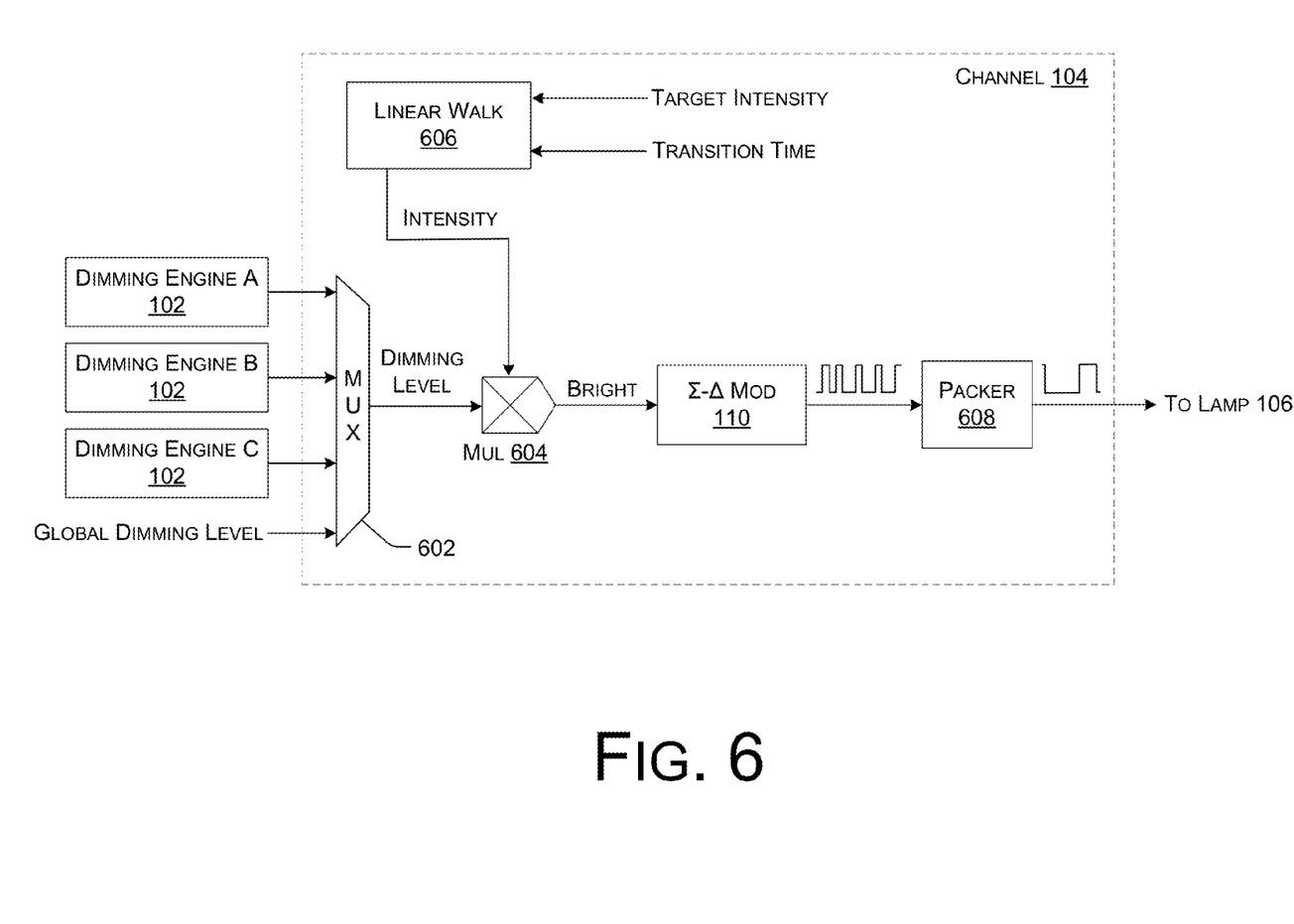
FIG. 6 is a block diagram showing example components of a channel, which may be employed as part of the BCCU of FIG. 5, for example, according to an implementation.

As discussed previously, multiple variable quantizers 300 may be used to provide control signals to multiple channels 104 of a lamp 106 (or other control system having multiple control signals). FIG. 5 shows a block diagram of an example brightness and color control unit (BCCU) 500, which may incorporate multiple variable quantizers 300, according to an implementation. In various implementations, the components of a variable quantizer 300 may be distributed. In the example shown in FIG. 5, the BCCU 500 includes at least 9 channels 104. In an example, each of the 9 channels 104 may include a variable quantizer 300 (as shown in FIG. 6) as part of a multi-channel brightness/color control arrangement 100. Additionally, some or each of the 9 channels 104 may be used to control the color and/or brightness of a lamp 106 or another type of control system using multiple control signals. In various implementations, a BCCU 500 may include fewer or additional channels 104, or components.

FIG. 6 is a block diagram showing example components of a channel 104, which may be employed as part of the BCCU 500 of FIG. 5, for example, according to an implementation. The example channel 104 may include some or all of the components discussed with respect to the example multi-channel brightness/color control arrangement 100. In alternate implementations, the channel 104 may include additional or alternate components.

As illustrated in FIG. 6, an example channel 104 may include multiple dimming engines 102 that may be multiplexed (at MUX 602) to form a single dimming level, for example. In an implementation, the MUX 602 may select the output of one dimming engine 102 as the input signal of the channel 104. In various implementations, the MUX 602 may alternate selection of the dimming engine 102 outputs, for example. Additionally, a global dimming level may also be multiplexed with individual dimming outputs from the dimming engines 102. The resulting dimming level output from the MUX 602 may be combined at a multiplier 604, for example, with a channel intensity value, as illustrated in FIG. 6. For example, the intensity value may be output from a linear walk arrangement 606, arranged to linearly transition changes in intensity.

As shown in FIG. 6, and discussed above, a modulator 110 receives the brightness signal, and the output of the modulator 110 is a high frequency bit stream. In various implementations, the modulator 110 employs a variable quantizer 300 to modify the frequency band of the output bit stream, spreading the frequency spectrum, as discussed above.

In some implementations, a bit packer 608 is arranged to receive the bit stream, and convert it to a signal that is more easily used by the lamp 106, or the like. For example, the bit packer 608 may convert the high frequency bit stream to another digital form with a lower rate of change.

In alternate implementations, such as the implementation of FIG. 6, various channel 104 configurations may be employed to provide brightness and/or color control to the lamp 106, or the like. In each of these channel 104 configurations, a variable quantizer 300 can be used to supply a spread spectrum output, as described above.

In various implementations, additional or alternative components may be used to accomplish the disclosed techniques and arrangements.

Representative Process

Figure 7:
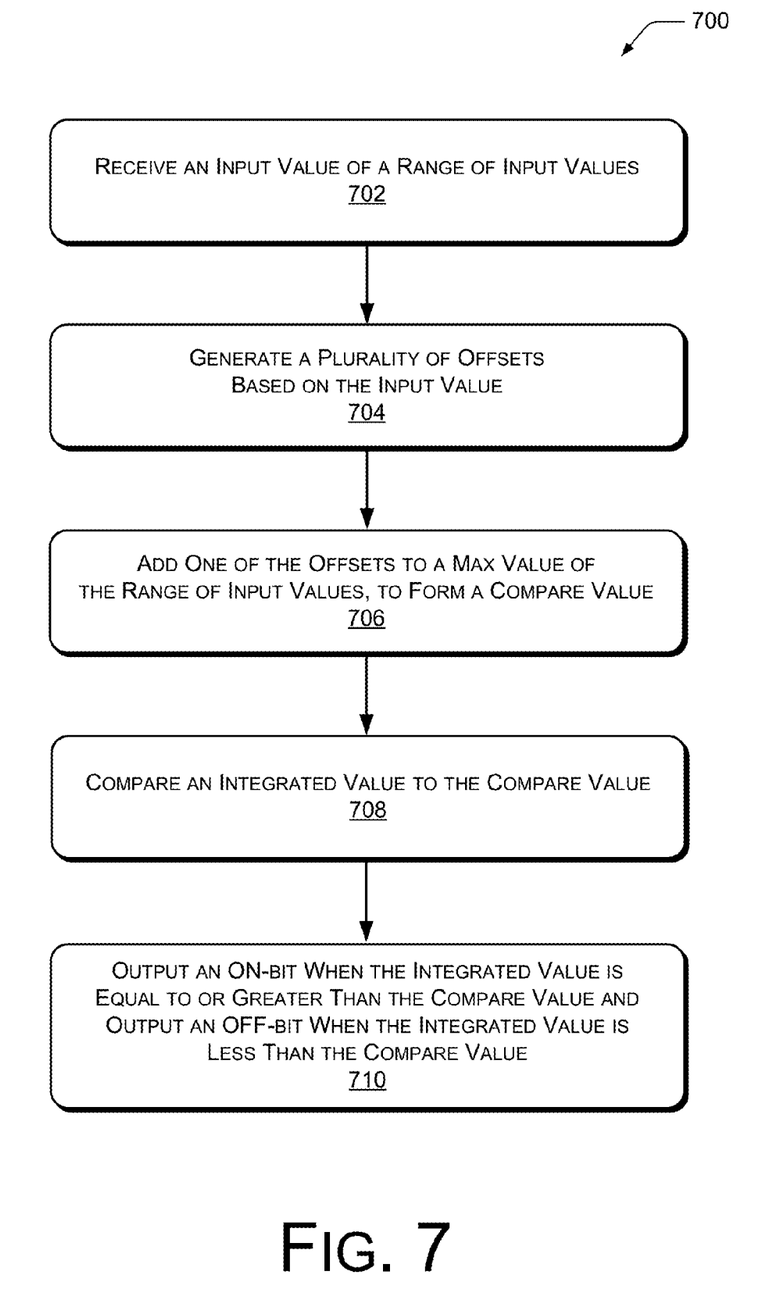
FIG. 7 is a flow diagram illustrating an example process for decreasing the periodicity and/or spreading the frequency spectrum of an output control signal bit stream, according to an implementation.

FIG. 7 is a flow diagram illustrating an example process 700 for decreasing the periodicity or spreading the frequency band of an output control signal, such as for a brightness component of a lamp (e.g., lamp 106), according to an implementation. The process 700 describes adding quasi-random high frequency noise to a compare value at a quantizer/comparator of a sigma-delta modulator (such as sigma-delta modulator 110, for example). A variable quantizer (such as variable quantizer 300, for example) may include a state machine (such as state machine 306, for example) to provide the quasi-random high frequency noise. The process 700 is described with reference to FIGS. 1-6.

The order in which the process is described is not intended to be construed as a limitation, and any number of the described process blocks can be combined in any order to implement the process, or alternate processes. Additionally, individual blocks may be deleted from the process without departing from the spirit and scope of the subject matter described herein. Furthermore, the process can be implemented in any suitable materials, or combinations thereof, without departing from the scope of the subject matter described herein.

At block 702, the process includes receiving an input value of a range of input values at a quantizer of a sigma-delta modulator (such as sigma-delta modulator 110, for example). In various implementations, the input value may be received from a dimming engine (such as dimming engine 102, for example, or the like). The range of input values may have a maximum value of $2^N$, for example, where N is the number of bits on the input. In one implementation, the input value represents a brightness level for a lamp (such as lamp 106, for example).

At block 704, the process includes generating a plurality of offsets based on the input value. For example, in an implementation, the process includes dividing the input value by a first divider value to form a first offset and dividing the input value by a second divider value to form a second offset, where the second divider value comprises a value having an opposite polarity and an equal magnitude to the first divider value. In alternate implementations, the offsets may be generated using many other techniques.

At block 706, the process includes adding one of the plurality of offsets to a maximum value of the range of input values, to form a compare value. In an implementation, a set of compare values is formed by individually adding or combining each of the plurality of offsets with the maximum value of the range of input values. Adding various offsets to the maximum value of the range of input values to form variable compare values is a technique for adding high frequency noise to the compare value of a comparator, since the maximum value of the range of input values is the compare value otherwise.

At block 708, the process includes comparing an integrated value of the sigma-delta modulator to the compare value. In an implementation, the compare value changes at each clock cycle. For example, one of the set of compare values is used as the compare value at one clock cycle and another of the set of compare values is used as the compare value at a subsequent clock cycle. In one implementation, each of the compare values in the set of compare values are used as the compare value in a predefined rotation.

In one implementation, the process includes changing the compare value of the quantizer at each clock cycle, including adding high frequency quasi-random noise to the compare value at each clock cycle, as described.

At block 710, the process includes outputting an ON-bit when the integrated value is equal to or greater than the compare value and outputting an OFF-bit when the integrated value is less than the compare value. In an implementation, the outputted bits are formed into a bit stream output.

In an implementation, the process includes generating a constantly varying quasi-random pulse density modulated output signal having a spread frequency spectrum.

In alternate implementations, other techniques may be included in the process 700 in various combinations, and remain within the scope of the disclosure.

Conclusion

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

What is claimed is:

1. A hardware device, comprising:
   a state machine arranged to output a compare value of a plurality of compare values during a clock cycle, the plurality of compare values formed by combining a fraction of an input value with a maximum value of an input range; and
   a comparator arranged to compare the compare value to an accumulated value and to output a non-periodic bit stream based on a result of the comparison.

2. The device of claim 1, further comprising a multiplexer arranged to output the plurality of compare values to the state machine.

3. The device of claim 1, further comprising an input component arranged to output the input value to the state machine if the input value is less than 50 percent of the maximum value of the input range, and to output another input value to the state machine, equal to one less than the maximum value of the input range reduced by the input value, if the input value is greater than 50 percent of the maximum value of the input range.

4. The device of claim 1, wherein the plurality of compare values are formed at least in part by adding a high frequency uncorrelated quasi-random noise to the maximum value of the input range.

5. The device of claim 1, wherein an average value of the plurality of compare values is substantially equal to the maximum value of the input range.

6. The device of claim 1, wherein the state machine is arranged to output each compare value of the plurality of compare values in a preselected rotation, one compare value per clock cycle.

7. The device of claim 1, wherein the comparator is arranged to output an on-bit when the accumulated value is equal to or greater than the compare value and to output an off-bit when the accumulated value is less than the compare value.

8. The device of claim 1, wherein the comparator is arranged to output an off-bit when the accumulated value is equal to or greater than the compare value and to output an on-bit when the accumulated value is less than the compare value.

9. The device of claim 1, wherein the comparator is arranged to generate a spread spectrum output signal.

10. A sigma-delta modulator, comprising:
    one or more integrators arranged to integrate an input signal to form an integrated signal; and
    a variable quantizer arranged to compare the integrated signal to a compare value and to output an on-bit when the integrated value is equal to or greater than the compare value and to output an off-bit when the integrated value is less than the compare value, the variable quantizer arranged to add uncorrelated quasi-random noise to the compare value at each clock cycle, such that the integrated signal is equal to or greater than the compare value at quasi-random time intervals.

11. The system of claim 10, further comprising a negative feedback path, the negative feedback path to be activated when the variable quantizer outputs an on-bit, and an activation of the feedback path to cause the integrated signal to decrease in value.

12. The system of claim 10, wherein the variable quantizer is further arranged to output a bit stream comprising a constantly varying quasi-random pulse density modulated signal.

13. The system of claim 12, wherein the added quasi-random noise decreases the periodicity of the output bit stream.

14. The system of claim 10, wherein the compare value changes at each clock cycle based on the added quasi-random noise.

15. The system of claim 10, wherein the output of the sigma-delta modulator has a spread spectrum frequency band based on the variable quantizer.

16. The system of claim 10, wherein the input signal comprises a brightness level and an output of the sigma-delta modulator is a non-periodic bit stream.

17. The system of claim 10, wherein the sigma-delta modulator is arranged to control at least one of a color intensity and a brightness of a lamp.

18. A method, comprising:
    receiving an input value of a range of input values at a quantizer of a sigma-delta modulator;
    generating a plurality of offsets based on the input value;
    adding one of the plurality of offsets to a maximum value of the range of input values, to form a compare value;
    comparing an integrated value of the sigma-delta modulator to the compare value; and
    outputting an on-bit when the integrated value is equal to or greater than the compare value and outputting an off-bit when the integrated value is less than the compare value.

19. The method of claim 18, further comprising:
    adding another of the plurality of offsets to the maximum value of the range of input values, to form a subsequent compare value;
    comparing the integrated value to the subsequent compare value; and
    outputting an on-bit when the integrated value is equal to or greater than the subsequent compare value and outputting an off-bit when the integrated value is less than the subsequent compare value.

20. The method of claim 18, further comprising dividing the input value by a first divider value to form a first offset and dividing the input value by a second divider value to form a second offset, the second divider value comprising a value having an opposite polarity and an equal magnitude to the first divider value.

21. The method of claim 18, further comprising changing the compare value of the quantizer at each clock cycle, including adding high frequency quasi-random noise to the compare value at each clock cycle.

22. The method of claim 18, further comprising generating a constantly varying quasi-random pulse density modulated output signal having a spread frequency spectrum.

23. The method of claim 18, wherein the input value represents a brightness level for a lamp.

24. A variable control system, comprising:
    a sigma-delta modulator arranged to receive an input signal and to generate a bit stream control signal based on the input signal, the sigma-delta modulator including:
    a noise generator arranged to combine quasi-random noise and a compare value at each clock cycle of the sigma-delta modulator, to form a variable compare value; and
    a comparator arranged to compare the variable compare value to an integrated value based on the input signal, and to output an on-bit when the integrated value is equal to or greater than the variable compare value and to output an off-bit when the integrated value is less than the variable compare value, subsequent on-bits and off-bits forming the bit stream control signal.

25. The variable control system of claim 24, further comprising a variable load arranged to receive the bit stream control signal, an intensity of the variable load being adjustable based on the bit stream control signal.

26. The apparatus of claim 24, wherein the noise generator is arranged to add one half of the value of the input signal to the compare value during one clock cycle of the sigma-delta modulator to form the variable compare value during the one clock cycle and arranged to subtract one half of the value of the input signal from the compare value during another clock cycle of the sigma-delta modulator to form the variable compare value during the other clock cycle.

\* \* \* \* \*